US008300480B2

(12) United States Patent
Furutani

(10) Patent No.: US 8,300,480 B2
(45) Date of Patent: Oct. 30, 2012

(54) SEMICONDUCTOR DEVICE HAVING SENSE AMPLIFIERS SUPPLIED WITH AN OVER-DRIVE VOLTAGE IN A NORMAL MODE AND SUPPLIED WITH A STEP-DOWN VOLTAGE IN A REFRESH MODE

(75) Inventor: Kiyohiro Furutani, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 168 days.

(21) Appl. No.: 12/897,399

(22) Filed: Oct. 4, 2010

(65) Prior Publication Data

US 2011/0080797 A1      Apr. 7, 2011

(30) Foreign Application Priority Data

Oct. 5, 2009   (JP) ................. 2009-231455

(51) Int. Cl.
*G11C 7/08*   (2006.01)
(52) U.S. Cl. ......... 365/189.15; 365/189.09; 365/189.11; 365/222; 365/208; 365/205; 365/196; 365/227
(58) Field of Classification Search .................. 365/208, 365/207, 222, 205, 196, 195, 190, 189.15, 365/189.09, 189.11, 227, 226
See application file for complete search history.

(56) References Cited

U.S. PATENT DOCUMENTS 5,363,333 A * 11/1994 Tsujimoto ..................... 365/201
6,735,145 B1 * 5/2004 Atallah et al. ............ 365/230.06
8,072,256 B2 * 12/2011 Pyeon ........................... 327/536

FOREIGN PATENT DOCUMENTS

JP   2003-68073 A   3/2003

* cited by examiner

*Primary Examiner* — Andrew Q Tran
(74) *Attorney, Agent, or Firm* — Sughrue Mion, PLLC

(57) ABSTRACT

A semiconductor device which has a sense amplifier and is supplied with an external power supply voltage includes a drive signal line connected to the sense amplifier, a step up circuit generating a first voltage from the external power supply voltage, the first voltage being higher than the external power supply voltage, and a step down circuit lowering the external power supply voltage into a second voltage. For enabling the sense amplifier to perform sensing operation in a normal mode involving external access, the first voltage is applied to the drive signal line in an initial stage of the sensing operation, and thereafter the second voltage is applied to the drive signal line. In a refresh mode not involving external access, the step up circuit is shut down, and the second voltage is applied to the drive signal line from the initial stage of the sensing operation.

17 Claims, 7 Drawing Sheets

SEMICONDUCTOR DEVICE HAVING SENSE AMPLIFIERS SUPPLIED WITH AN OVER-DRIVE VOLTAGE IN A NORMAL MODE AND SUPPLIED WITH A STEP-DOWN VOLTAGE IN A REFRESH MODE

BACKGROUND OF THE INVENTION

1. Field of the Invention

The present invention relates to a semiconductor device having sense amplifiers.

2. Description of Related Art

One typical semiconductor device having sense amplifiers is a dynamic semiconductor memory device, for example. The semiconductor memory device has sense amplifiers connected to bit line pairs connected to memory cells. When data are read from a memory cell, the sense amplifier amplifies a small potential difference output from the memory cell to the bit line pair. As such semiconductor memory devices are integrated to a higher degree, their storage capacity increases, but they are required to reduce electric power consumption and to operate at higher speeds.

For reducing the electric power consumption of a semiconductor memory device, it is effective to lower the operating voltage of internal circuits thereof. For example, if an external power supply voltage of +1.8 V is applied to a semiconductor memory device, then a step down circuit in the semiconductor memory device generates an internal power supply voltage of +1.05 V, for example, from the external power supply voltage, and the internal power supply voltage is supplied as an array voltage VARY to a memory cell array. The memory cell array comprises a plurality of memory cells, a decoder accessing the memory cells, and sense amplifiers sensing memory cell information. The array voltage VARY is a charging voltage for the bit lines, i.e., an equalizing voltage. If the array voltage VARY is lowered to lower the charging potential for the bit lines, then according to the known ½ equalizing scheme, the potential of the power supply for the sense amplifier is lowered, and the sensing time is increased. The sensing time refers to a time required after the sense amplifier has started to amplify the small potential difference on the bit line pair until the potential between the bit lines of the bit line pair increases to a prescribed potential difference which is regarded as being of a substantially constant value. The prescribed potential difference is of a value which is 95% of the array voltage VARY, for example.

For reading data from a semiconductor memory device, it is the general practice to make a word line active to select a memory cell and transmit its information to bit lines, starting to operate a sense amplifier, and thereafter to select a Y-selection signal line with a Y-decoder at the time the output from the sense amplifier is established, decoding an output potential difference from the sense amplifier. If the sensing time is increased, then as the potential difference between the bit lines is read when the potential difference is not yet sufficiently large, the potential difference cannot properly be read. Consequently, it is necessary to increase the time required after the word line is selected until the Y-decoder selects the Y-selection signal line. This means a reduction in the rate at which to read data from the semiconductor memory device to an external circuit.

In order to reduce the sensing time and realizing high-speed operation of the semiconductor memory device, it has been customary to supply an overdrive voltage VOD higher than the array voltage VARY (VOD>VARY) to the sense amplifier to energize the sense amplifier with the overdrive voltage VOD in an initial stage of the operation of the sense amplifier. Such a process is referred to as an overdrive technique. If the array voltage VARY is +1.05 V, for example, then the overdrive voltage VOD is set to about +1.4 V.

If the semiconductor memory device is of the dynamic type, then in order to hold or maintain the data in the memory cells, it is necessary to periodically perform a refreshing mode to restore the same data in the memory cells by operating the sense amplifiers on the memory cells to periodically read the data. Unlike reading the data in the semiconductor memory device from an external circuit, however, the refreshing mode is carried out simultaneously on the many memory cells of the semiconductor memory device. Consequently, if the overdrive voltage is applied in the refreshing mode, the peak currents which flow while the sense amplifiers are in operation increase, resulting a reduction in the internal voltage and the generation of noise. To solve these problems, JP-2003-68073A discloses that a lower overdrive voltage is used in the refreshing mode than when the data in the semiconductor memory device are read from an external circuit. Specifically, when the semiconductor memory device is in a normal mode of operation to output the stored data to the external circuit, the external power supply voltage is used as the overdrive voltage, and when the semiconductor memory device is in the refreshing mode and does not output the stored data to the external circuit, a second overdrive voltage which is generated from the external power supply voltage by a step down circuit and lower than the external power supply voltage is applied to the sense amplifiers.

As described above, semiconductor devices, typically semiconductor memory devices, use an overdrive voltage in an initial stage of the operation of the sense amplifiers.

For reducing the electric power consumption of semiconductor devices, efforts are being made to lower the external power supply voltage that is applied to the semiconductor devices. For example, it has been attempted to use an external power supply voltage of +1.2 V for dynamic semiconductor memory devices. However, though an array voltage VARY of +1.05 V can be generated from the external power supply voltage of +1.2 V by a step down circuit, an overdrive voltage of about +1.4 V cannot be generated from the external power supply voltage of +1.2 V by a step down circuit. Therefore, a step up circuit such as a charge pump circuit mounted on the semiconductor chip is used to generate a voltage of about +1.8 V from the external power supply voltage, and then an overdrive voltage of about +1.4 V is generated from the voltage of about +1.8 V by a step down circuit.

When the overdrive voltage is generated from the external power supply voltage by the charge pump circuit, the pump efficiency of the charge pump circuit becomes about 2.5 times under the above voltage conditions, and the current consumed when the sense amplifiers are in operation increases 2.5 times. Though a step up circuit other than the charge pump circuit may be used, such a step up circuit still causes a large increase in the current consumed when the sense amplifiers are in operation.

As described above, if an external power supply voltage supplied to a semiconductor device with sense amplifiers is lowered, it is necessary for the semiconductor device to have a step up circuit for generating an overdrive circuit. However, the step up circuit causes a large increase in the electric power consumption of the semiconductor device.

SUMMARY

A semiconductor device according to the present invention is supplied with an external power supply voltage, and includes a sense amplifier, a drive signal line connected to the sense amplifier, the drive signal line supplying electric power required to operate the sense amplifier, a step up circuit generating a first voltage from the external power supply voltage, the first voltage being higher than the external power supply voltage, and a step down circuit lowering the external power supply voltage into a second voltage. When enabling the sense amplifier to perform sensing operation in a normal mode, the first voltage is applied to the drive signal line and thereafter the second voltage is applied to the drive signal line in an initial stage of the sensing operation. In a refresh mode, the step up circuit is shut down, and the second voltage is applied to the drive signal line from the initial stage of the sensing operation.

Since the step up circuit is shut down in the refresh mode, the power consumption of the overall semiconductor device is reduced. In the refresh mode not involving external access, conditions about operation timings of the semiconductor device are less strict than in the normal mode involving external access such as outputting data to an external circuit. Therefore, the conditions about operation timings can sufficiently be met even when the step up circuit is shut down and the semiconductor device is not in overdriving operation in the refresh mode.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

Figure 1:
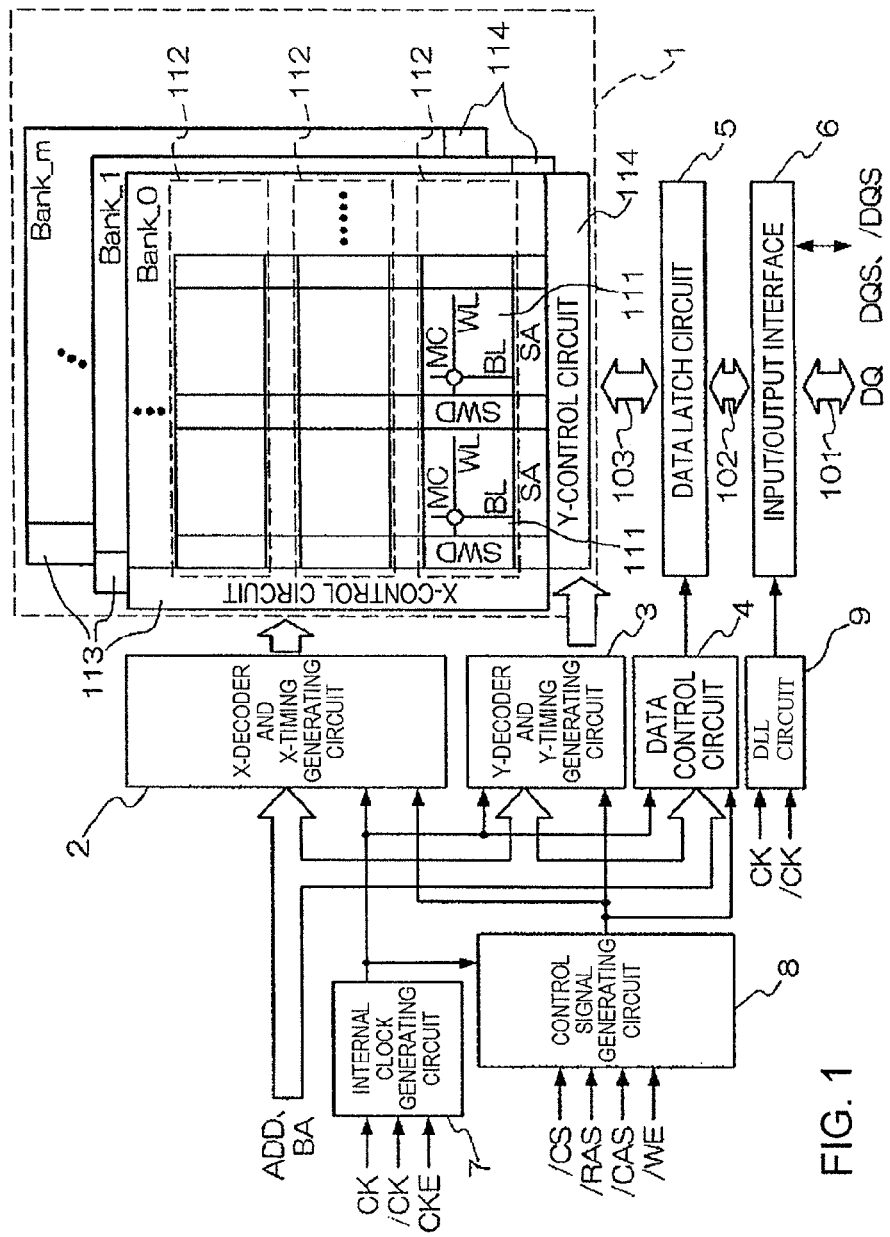
FIG. 1 is a block diagram showing an overall configuration of a semiconductor memory device as an example of a semiconductor device according to an exemplary embodiment of the present invention.

An exemplary embodiment of the technical concept for solving the problems addressed by the present invention will be illustrated below. However, details included in the technical scope of the present invention are not limited to the technical concept, but should be interpreted as falling within the scope of the appended claims.

A semiconductor device according to the present invention, which is supplied with an external power supply voltage, uses a lowered voltage that is produced by lowering the external power supply voltage as an internal power supply voltage. Particularly, a semiconductor device having sense amplifiers supplies an overdrive voltage which is higher than the internal power supply voltage and higher than the external power supply voltage as a power supply voltage for the sense amplifiers in an initial stage of sensing operation of the sense amplifiers, and uses the lowered voltage in a later stage of sensing operation. For making the overdrive voltage higher than the external power supply voltage, it is necessary to use a step up circuit to generate the overdrive voltage. If an overdrive voltage is generated by a step up circuit in a refresh mode in a dynamic semiconductor memory device, for example, then since the number of sense amplifiers that operate simultaneously is large, the power consumption of the semiconductor memory device is greatly increased. The overdrive voltage used in the initial stage of sensing operation and the lowered voltage used in the later stage of sensing operation are applied to higher-potential line CSP among a pair of drive signal lines CSP, CSN which supply electric power to the sense amplifiers. The present invention is concerned with the control of the voltage of higher-potential drive signal line CSP. In the refresh mode, a boosting process for generating the overdrive voltage that is higher than the external power supply voltage is stopped, and the lowered voltage is applied to higher-potential drive signal line CSP from the initial stage of sensing operation. Therefore, the power consumption in the refresh mode is reduced, and hence the power consumption of the overall semiconductor device is reduced. If the refresh mode is performed in each of a succession of refreshing cycles, the boosting process does not need to be stopped in all the refreshing cycles, but may be stopped in some of the refreshing cycles to reduce the power consumption. Stopping the boosting process in only some of the refreshing cycles is covered by the technical concept for solving the problems addressed by the present invention.

No external access is involved in the refresh mode. For example there is no need to perform a process of outputting data read from memory cells through the sense amplifiers to an external circuit. Consequently, requirements for operating timings are less strict than in a normal mode which involves external access such as for outputting the data to the external circuit. As a result, even if the semiconductor device performs its sensing operation without using the overdrive voltage generated by the step up circuit in the refresh mode, the semiconductor device is allowed to operate normally.

A semiconductor device according to an exemplary embodiment of the present invention will be described in detail below with reference to the drawings.

FIG. 1 is a block diagram showing an overall configuration of a DRAM (Dynamic Random Access Memory) as a semiconductor device according to an exemplary embodiment of the present invention. As shown in FIG. 1, the DRAM comprises memory array 1, X-decoder and X-timing generating circuit 2, Y-decoder and Y-timing generating circuit 3, data control circuit 4, data latch circuit 5, input/output interface 6, internal CLK (clock) generating circuit 7, control signal generating circuit 8, and DLL (Delay Locked Loop) circuit 9.

Memory array 1 comprises a number of memory cells MC which hold data. Memory array 1 is connected to data latch circuit 5 by data transfer bus 103. Data latch circuit 5 is connected to input/output interface 6 by data transfer bus 102. Input/output interface 6 inputs and outputs data (DQ) and also inputs and outputs data strobe signals DQS, /DQS from and to an external circuit through data transfer bus 101. The data transfer between memory array 1, data latch circuit 5, and input/output interface 6 is controlled by data control circuit 4. The timing to input and output data (DQ) and also to output data strobe signals DQS, /DQS at input/output interface 6 is controlled by DLL circuit 9 which is supplied with clock signals CK, /CK from an external circuit.

Memory array 1 includes a plurality of memory mats 111 each comprising a plurality of memory cells MC disposed at the intersections of a plurality of word lines WL and a plurality of bit lines BL. An array of memory mats 111 serves as a memory mat array 112, and a plurality of memory mat arrays 112 make up a bank. Illustrated memory array 1 includes (m+1) banks (Bank_0, Bank_1, . . . , Bank_m) where m represents an integer of 1 or greater. Each of the banks is combined with X-control circuit 113 and Y-control circuit 114. Each memory mat 111 is surrounded by a sense amplifier area (SA) including a sense amplifier array which comprises a plurality of sense amplifiers amplifying information read from memory cells MC and a sub-word driver area (SWD) including a sub-word driver array which comprises a plurality of sub-word driver circuits driving a plurality of word lines WL.

Memory array 1 is controlled by X-decoder and X-timing generating circuit 2 and Y-decoder and Y-timing generating circuit 3, which are controlled by control signal generating circuit 8. Particularly, X-decoder and X-timing generating circuit 2 controls X-control circuits 113 of the respective banks, and Y-decoder and Y-timing generating circuit 3 controls Y-control circuits 114 of the respective banks.

Internal clock generating circuit 7 generates an internal clock signal to be supplied to X-decoder and X-timing generating circuit 2, Y-decoder and Y-timing generating circuit 3, and control signal generating circuit 8, based on clock signals CK, /CK and clock enable signal CKE supplied from an external circuit. Control signal generating circuit 8 outputs control signals to X-decoder and X-timing generating circuit 2, Y-decoder and Y-timing generating circuit 3, and data control circuit 4 based on chip select signal /CS, row address strobe signal /RAS, column address strobe signal /CAS, and write enable signal /WE. Address ADD and bank address BA are given to X-decoder and X-timing generating circuit 2, Y-decoder and Y-timing generating circuit 3, and data control circuit 4.

A plurality of power supply circuits supplying high-potential electric power to the sense amplifiers, i.e., a plurality of step down circuits and step up circuits to be described later, are omitted from illustration in FIG. 1.

Figure 2:
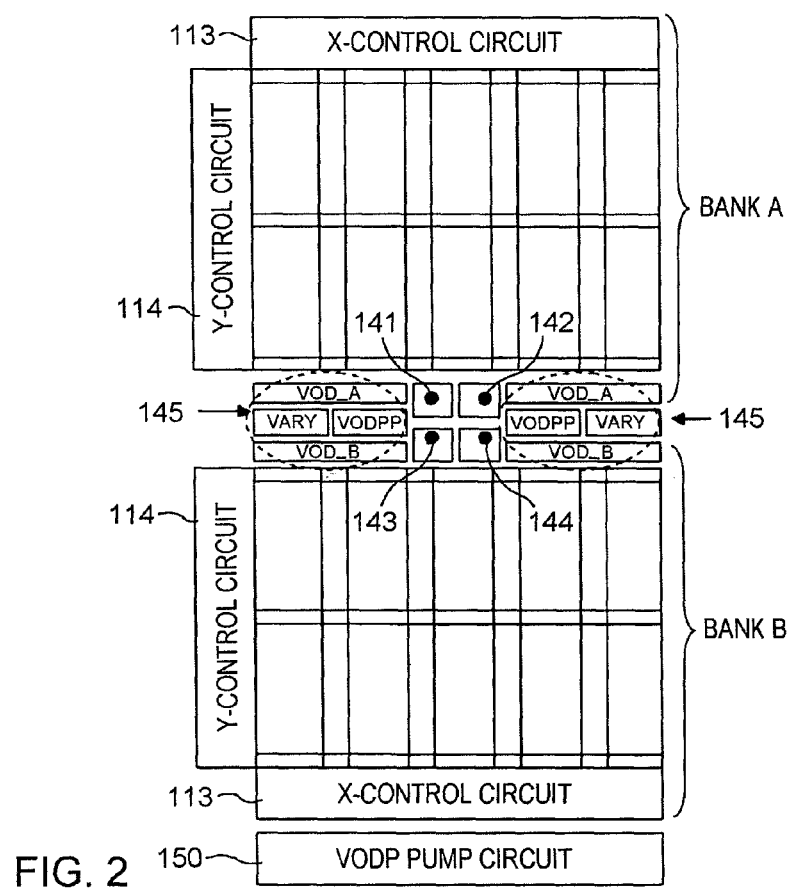
FIG. 2 is a plan view showing the layout of circuits in a portion of the semiconductor memory device.

FIG. 2 shows a configuration of two adjacent banks, e.g., Bank_0, Bank_1, in the semiconductor device shown in FIG. 1. It is assumed that these two adjacent banks are bank A and bank B which are adjacent to each other in a Y-axis direction. Each of bank A and bank B is combined with X-control circuit 113 and Y-control circuit 114. Each of bank A and bank B is shaped as a rectangular area that is elongate in an X-axis direction.

Bank A and bank B are disposed adjacent to each other across a region which includes driver 141 supplying overdrive voltage VOD to bank A, active-mode driver 142 supplying array voltage VARY to bank A, driver 143 supplying overdrive voltage VOD to bank B, active-mode driver 144 supplying array voltage VARY to bank B, and compensation capacitance groups 145. Each of drivers 141, 143 which supplies overdrive voltage VOD includes a plurality of step down circuits (step down circuits 251, 252, 253 to be described later). Driver 142 which supplies array voltage VARY includes a step down circuit (step down circuit 254 to be described later). Compensation capacitance groups 145 include capacitors VOD_A for acting on the overdrive voltage applied to bank A, capacitors VOD_B for acting on the overdrive voltage applied to bank B, capacitors VARY shared by bank A and bank B for acting on array voltage VARY, and capacitors VODPP shared by bank A and bank B for acting on voltage VODPP increased by a step up circuit.

Bank A and bank B share VODP pump circuit 150 generating overdrive voltage VODP which is higher than an external power supply voltage. In FIG. 2, VODP pump circuit 150 is disposed near bank B.

Figure 3:
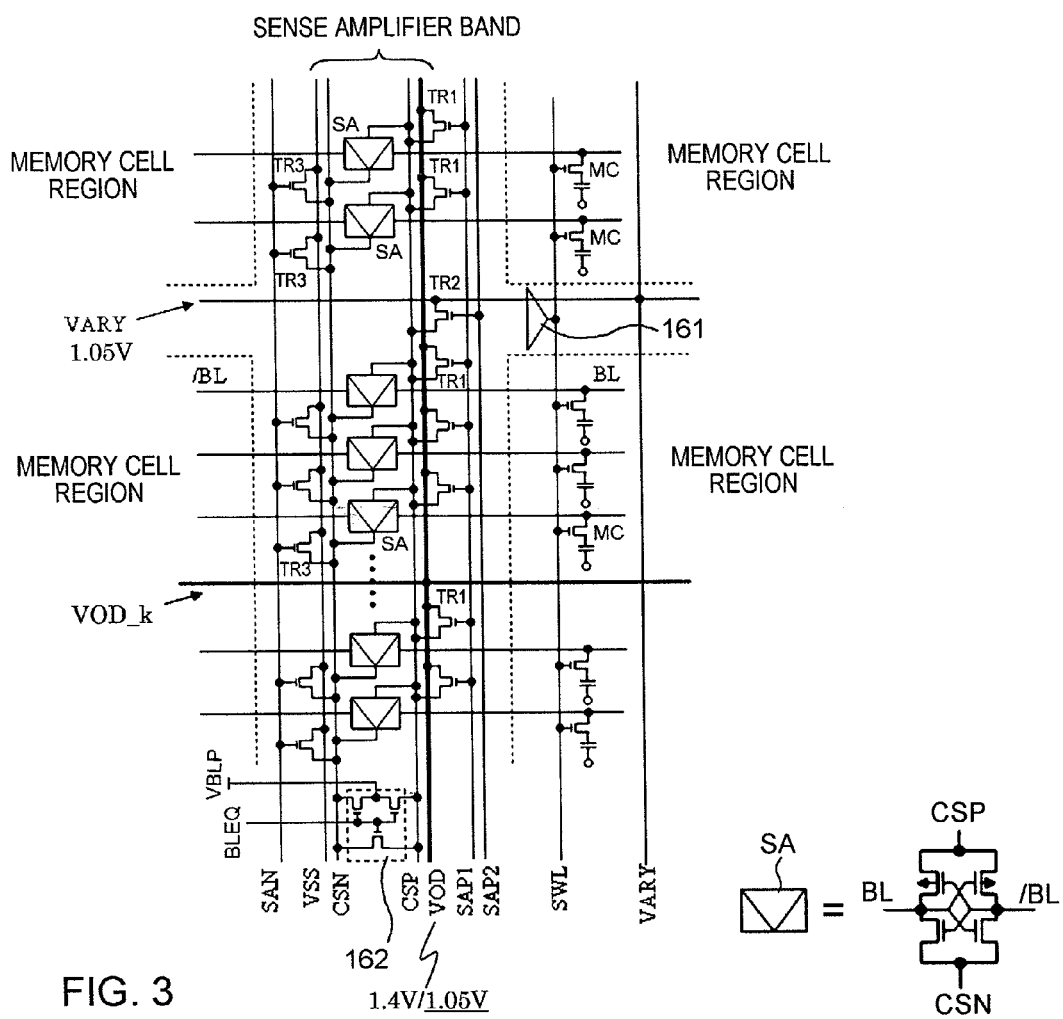
FIG. 3 is a circuit diagram showing a circuit arrangement of a memory mat.

FIG. 3 shows by way of example a circuit arrangement of memory mat 111 of each bank. Memory mat 111 is divided into a plurality of memory cell areas each comprising a plurality of memory cells MC. Each memory cell MC is of a standard configuration including one transistor and one capacitor. The transistors of memory cells MC have respective gates connected to sub-word line SWL which extends vertically in FIG. 3, i.e., in the Y-axis direction, so that memory cells MC are arranged in a column in FIG. 3. The transistors of memory cells MC have respective drains connected respectively to a plurality of bit lines BL which extends horizontally in FIG. 3, i.e., in the X-axis direction. Though only one column of memory cells is illustrated, memory mat 111 includes a plurality of columns of the memory cells. The transistors of a plurality of memory cells belonging to another column have respective drains connected to a plurality of bit lines /BL. Bit line BL and bit line /BL make up a bit line pair. Memory mat 111 includes sub-row decoder 161 which decodes sub-word line SWL. Sub-word line SWL and sub-row decoder 161 shown in FIG. 3 correspond respectively to word line WL and the sub-word driver shown in FIG. 1. A plurality of sub-row decoders 161 make up a sub-word driver array extending in the X-axis direction.

Sense amplifier SA comprises a flip-flop circuit including two cross-coupled inverters, and is of a general configuration comprising two P-channel FETs (field effect transistors) and two N-channel FETs. Sense amplifier SA has two input nodes connected respectively to bit line BL and bit line /BL. A sense amplifier is connected to each bit line pair. Therefore, a plurality of sense amplifiers are arranged in a vertical array in FIG. 3, making up a sense amplifier band or a sense amplifier column. The sense amplifier band includes high-potential drive signal line CSP, i.e., a line CSP for a sense amplifier drive signal on P-channel side, and a low-potential drive signal line CSN, i.e., a line CSN for a sense amplifier drive signal on N-channel side. Each of sense amplifiers SA is connected to lines CSP, CSN. Equalizing circuit 162 which equalizes the potentials on lines CSP, CSN to potential VBLP with equalizing signal BLEQ is also connected to lines CSP, CSN. Potential VBLP is one-half of array voltage VARY, for example. Equalizing circuit 162 is of a general configuration which comprises two transistors for connecting a line for potential VBLP to lines CSP, CSN, respectively, and one transistor for connecting lines CSP, CSN to each other, the transistors having respective gates supplied with equalizing signal BLEQ. Although not shown, each bit line pair is associated with a similar equalizing circuit for equalizing the potentials on bit lines BL, /BL to potential VBLP with equalizing signal BLEQ.

Lines CSP, CSN serve to supply an operating power supply voltage to sense amplifiers SA at operation timings to be described later. The sense amplifier band also includes a line for ground potential VSS and a line for overdrive voltage VOD. A line for array voltage VARY extends across the sense amplifier band. The line for overdrive voltage VOD corresponds to the first line and also serves as a line for overdrive voltage VOD_k to be described later, where "k" indicates that the overdrive voltage is applied to bank k. The line for array voltage VARY corresponds to the second line. The sense amplifier band also includes lines for timing signals SAN, SAP1, SAP2 for controlling the operation of the sense amplifiers. A plurality of transistors TR1 whose gates are controlled by timing signal SAP1 are connected between the line for overdrive voltage VOD and line CSP. Transistors TR1 are associated respectively with sense amplifiers SA and disposed physically closely to sense amplifiers SA. A plurality of transistors TR2 whose gates are controlled by timing signal SAP2 are connected between the line for array voltage VARY and line CSP. In the illustrated exemplary embodiment, transistors TR1, TR2 operate as CSP drive transistors supplying a potential to line CSP. One transistor TR1 is assigned to each sense amplifier SA, and one transistor TR2 is assigned to a plurality of sense amplifiers SA. In other words, transistor TR2 is disposed in a crossing region where the sense amplifier column and the sub-word driver array cross each other. In memory array 1, the total number of transistors TR1 is greater than the total number of transistors TR2. The total current drive capability of transistors TR1 is greater than the total current drive capability of transistors TR2. A plurality of transistors TR3 whose gates are controlled by timing signal SAN are connected between line CSN and ground potential VSS. One transistor TR3 is assigned to each sense amplifier SA.

Figure 4:
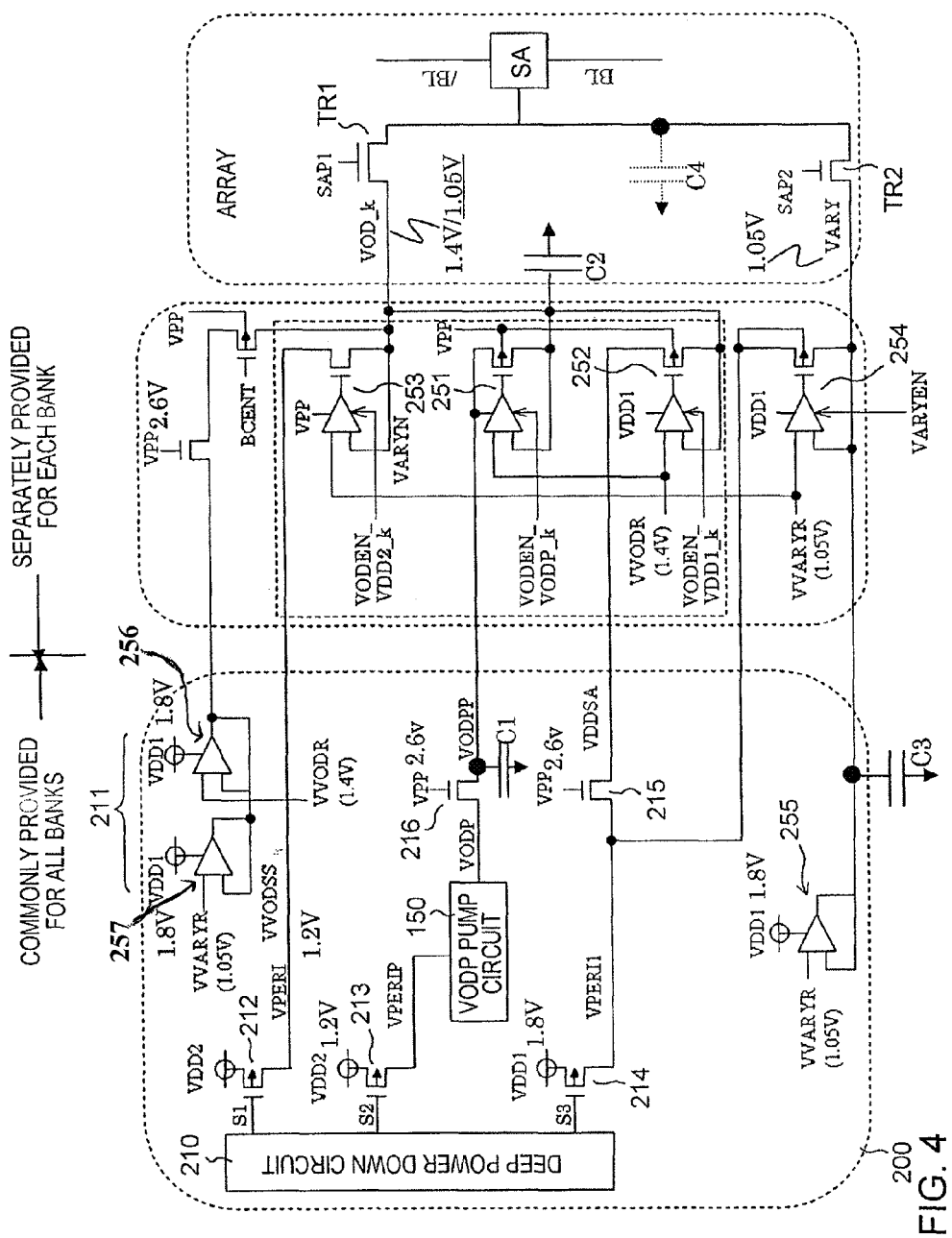
FIG. 4 is a circuit diagram showing a circuit region which generates an operating voltage for a sense amplifier.

FIG. 4 shows a region of the semiconductor device shown in FIGS. 1 to 3 for supplying a voltage to high-potential line CSP, among lines CSP, CSN which supplies electric power to sense amplifiers SA.

It is assumed that the semiconductor device is a two-power-supply device which is supplied with two external power supply voltages having differential potentials from external terminals, e.g., first external power supply voltage VDD1 of +1.8 V and second external power supply voltage VDD2 of +1.2 V. First external power supply voltage VDD1 of +1.8 V is an auxiliary external power supply voltage that is additionally used to optimize the drive capabilities of the driver circuits in the semiconductor device for reduced power consumption, and is not essential in the semiconductor device according to the present exemplary embodiment. In other words, the present invention is effective with second external power supply voltage VDD2 of +1.2 V only. The semiconductor device includes a step up circuit, different from the step up circuit for generating the overdrive voltages, for generating bias power supply voltage VPP of +2.6 V, for example. As bias power supply voltage VPP is applied only to the gates and back gates of the transistors, except as a potential supplied to sub-word line SWL, essentially no current flows under bias power supply voltage VPP, and hence bias power supply voltage VPP does not increase the power consumption of the semiconductor device. There are several transfer gates which are supplied with bias power supply voltage VPP, and these transfer gates do not have an essential effect on the operation of the semiconductor device according to the present exemplary embodiment. It is assumed that the overdrive voltage generated by the step up circuit, i.e., the first voltage, has a value of +1.4 V, array voltage VARY, i.e., the second voltage, has a value of +1.05 V, bias power supply voltage VPP has a value of +2.6 V, first external power supply voltage VDD1 has a value of +1.8 V, and second external power supply voltage VDD2 has a value of +1.2 V. However, these voltage values are given by example only, and different voltage values may be employed.

Common circuit 200 is shared by a plurality of banks of memory array 1. Common circuit 200 comprises VODP pump circuit 150 (see also FIG. 2), deep power down circuit 210 serving as the control circuit which generates control signals S1, S2, S3 for partially shutting down the circuits in the semiconductor device, driver 211 generating an overdrive voltage to be used in a standby mode, transistor 212 generating voltage VPERI of +1.2 V from second external power supply voltage VDD2 when its gate is controlled by control signal S1, transistor 213 generating voltage VPERIP to be used as a power supply voltage for operating VODP pump circuit 150 from second external power supply voltage VDD2 when its gate is controlled by control signal S2, transistor 214 generating voltage VPERI1 of +1.8 V from first external power supply voltage VDD1 when its gate is controlled by control signal S3, transfer gate 215 connected to a line for voltage VPERI1, driver 255 having an amplifier and generating array voltage VARY to be used in the standby mode, and transfer gate 216 connected to the output terminal of VODP pump circuit 150.

Driver 211 comprises amplifier 256 operable as a constant-voltage circuit supplied with reference voltage VVVOD of +1.4 V for an overdrive voltage, and amplifier 257 operable as a constant-voltage circuit supplied with reference voltage VVARYR of +1.05 V for array voltage VARY. Driver 211 generates overdrive voltage VVODSS for compensating for a leakage from the line of voltage VOD_k in the memory mat. Since the present exemplary embodiment is concerned with the control of the operation of the step up circuit (i.e., VODP pump circuit 150) in the refreshing mode, driver 211 for leakage compensation and circuit components associated therewith do not have any essential effect on the operation of the semiconductor device according the present exemplary embodiment.

VODP pump circuit 150 is supplied with external power supply voltage VDD2 of +1.2 V as VPERIP through transistor 213, and serves as a circuit generating voltage VODP of +1.8 V with an operating voltage of +1.2 V. Voltage VODP which has passed through transfer gate 216 is referred to as voltage VODPP. Capacitor C1 is connected to a line for voltage VODPP. Capacitor C1 is a compensation capacitor denoted "VODPP" in FIG. 2. VODP pump circuit 150 and step down circuit 251 as the second step down circuit to be described later function as a step up circuit which is supplied with external power supply voltage VDD2 and generates a first voltage higher than external power supply voltage VDD2.

Driver 255 generating array voltage VARY in the standby mode has an amplifier operable as a constant-voltage circuit supplied with reference voltage VVARYR of +1.05 V. The amplifier has an output terminal connected to the line for array voltage VARY. The line for array voltage VARY is the second line to which capacitor C3 is connected. Capacitor C3 is a compensation capacitor denoted "VARY" in FIG. 2.

In FIG. 2, each bank is combined with drivers 142, 144 which supply array voltage VARY in an active mode. However, in FIG. 4, a driver supplying array voltage VARY in an active mode is represented by step down circuit 254 which corresponds to the first step down circuit. Step down circuit 254 comprises an amplifier supplied with reference voltage VVARYR as an input and a transistor having a gate connected to the output terminal of the amplifier. The transistor has a drain supplied with voltage VPERI1 and a source serving as an output of step down circuit 254. This output signal is fed back to the amplifier. The amplifier is also supplied with signal VARYEN as an activating signal for step down circuit 254. The output of step down circuit 254 is connected to the line for array voltage VARY, which is connected to line CSP through transistor TR2 whose gate is controlled by timing signal SAP2. Step down circuit 254 has a small current drive capability because it is used after an overdrive period of the sense amplifier is finished. In FIG. 4, step down circuit 254 generates array voltage VARY of +1.05 V from first external power supply voltage VDD1 of +1.8 V. However, step down circuit 254 may generate array voltage VARY of +1.05 V from second external power supply voltage VDD2 of +1.2 V. Step down circuit 254 functions as the first step down circuit. Since driver 255 generating array voltage VARY in the standby mode also lowers the external power supply voltage, step down circuit 254 and driver 255 may be combined into one circuit.

Although FIG. 2 illustrates that each bank is combined with drivers 141, 143 supplying overdrive voltage VOD, FIG. 4 illustrates that the driver supplying the overdrive voltage comprises three step down circuits 251, 252, 254.

Step down circuit 251 which functions as the second step down circuit comprises an amplifier supplied with, as an input, reference voltage VVODR of +1.4 V for the overdrive voltage at the time the step up circuit is in use, and a transistor having a gate connected to the output terminal of the amplifier. The transistor has a drain supplied with voltage VODPP which is a voltage supplied from VODP pump circuit 150 via transfer gate 216. The amplifier is also supplied with signal VODEN_VODP_k as an activating signal for step down circuit 251. The output of step down circuit 251, i.e., the source of the transistor, is fed back to the input terminal of the amplifier and connected to a line for overdrive voltage VOD_k. The line for overdrive voltage VOD_k is connected to line CSK through transistor TR1 whose gate is controlled by timing signal SAP1, as described above. The line for overdrive voltage VOD_k functions as the first line.

Step down circuit 252 comprises an amplifier supplied with reference voltage VVODR of +1.4 V as an input and a transistor having a gate connected to the output terminal of the amplifier. The transistor has a drain supplied with voltage VDDSA which is voltage VPERI1 supplied via transfer gate 215. The amplifier is also supplied with signal VODEN_VDD1_k as an activating signal for step down circuit 252. The output of step down circuit 252, i.e., the source of the transistor, is fed back to the input terminal of the amplifier and connected to the line for overdrive voltage VOD_k. Step down circuit 252 operates with external power supply voltage VDD1 of +1.8 V. Alternatively, step down circuit 252 may be dispensed with if the semiconductor device employs a single external power supply voltage of +1.2 V, and does not have an essential effect on the operation of the semiconductor device according to the present exemplary embodiment.

Step down circuit 253 comprises an amplifier supplied with reference voltage VVARYR of +1.05 V as an input and a transistor having a gate connected to the output terminal of the amplifier. The transistor has a source supplied with voltage VPERI of +1.2 V. The amplifier is also supplied with signal VODEN_VDD2_k as an activating signal for step down circuit 253. The output of step down circuit 253, i.e., the drain of the transistor, is connected to the line for overdrive voltage VOD_k. Step down circuit 253 generates voltage VARYN of +1.05 V, as with voltage VARY, from the voltage source of +1.2 V and has a small voltage drop of 0.15 V. While step down circuits 251, 252, 254 employ P-channel FETs as their transistors, step down circuit 253 employs an N-channel FET as its transistor. Step down circuit 253 serves as the auxiliary step down circuit. The current drive capability of step down circuit 253 is greater than the current drive capability of step down circuit 254 because it is a circuit for supplying the voltage to the sense amplifier SA in at least an initial stage of operation of the sense amplifier SA in the refreshing mode.

Voltage VVODSS for leakage compensation which is generated by driver 211 is applied to the line for overdrive voltage VOD_k through a transfer gate and a transistor whose gate is controlled by signal BCENT. Capacitor C2 as the first capacitor is also connected to the line for overdrive voltage VOD_k. Capacitor C2 is a compensation capacitor denoted "VOD_k" in FIG. 2.

In FIG. 4, sense amplifier SA, line CSP connected to sense amplifier SA, and two transistors TR1, TR2 connected to line CSP are shown as circuit components in the memory array. These circuit components are the same as those represented by the same reference characters in FIG. 3. Transistor TR1 serves as the first switch which connects line CSP to line for overdrive voltage VOD_k when its gate is controlled by timing signal SAP1, and transistor TR2 serves as the second switch which connects line CSP to line for array voltage VARY when its gate is controlled by timing signal SAP2. Line CSP is accompanied by a parasitic capacitance as the second capacitor which is indicated by capacitor C4. Timing signal SAP1 and timing signal SAP2 are generated by control signal generating circuit 8 (see FIG. 1). Control signal generating circuit 8 is supplied with a signal, not shown, indicative of a refresh mode (a self refresh mode in Examples to be described later) that is recognized by internal clock generating circuit 7 (see FIG. 1). Control signal generating circuit 8 changes from the time control of timing signal SAP1 and timing signal SAP2 in a normal mode other than the self refresh mode to the time control of timing signal SAP1 and timing signal SAP2 in the self refresh mode, as described in detail later. Activating signal VODEN_VDD1_k, activating signal VODEN_VDD2_, activating signal VODP_k, activating signal VARYEN, and signal SENSEOK, etc. for controlling respective drivers are also generated by internal clock generating circuit 7.

When the semiconductor device according to the present exemplary embodiment is in the normal mode, voltage VODP of +1.8 V generated from external power supply voltage VDD2 of +1.2 V by VODP pump circuit 150 is lowered into an overdrive voltage of +1.4 V, which is applied to line CSP in an initial stage of sensing operation, thereby shortening period tRCD from the application of an active command indicative of the timing to supply a row address to the application of a read command or a write command indicative of the timing to supply a column address in the semiconductor device, to make it possible for the semiconductor device to operate at a high speed. In the refresh mode, VODP pump circuit 150 is shut down, and step down circuit 251 generating the overdrive voltage of +1.4 V is also shut down. A voltage of +1.05 V generated from the external power supply voltage only by the step down circuit, without involving the step up circuit, is applied to line CSP from the initial stage of sensing operation. Thus, an increase in the power consumption which is caused if VODP pump circuit 150 as a step up circuit generates an overdrive voltage is prevented, thereby allowing the semiconductor device to consume reduced electric power.

Generally, when clock enable signal CKE which is one of the control signals applied to the semiconductor device is inactivated, the semiconductor device enters the self refresh mode, and internal clock generating circuit 7 shown in FIG. 1 outputs signal SELFSENSE, not shown, indicative of the self refresh mode. When signal SELFSENSE is output, control signal S2 is applied from deep power down circuit 210 to stop the supply of the power supply voltage of +1.2 V to VODP pump circuit 150, thereby shutting down VODP pump circuit 150. Even if the supply of the power supply voltage of +1.2 V to VODP pump circuit 150 is not stopped, VODP pump circuit 150 may virtually be shut down by inactivating step down circuit 251. Such a case is also covered by the present exemplary embodiment because VODP pump circuit 150 has an output voltage detecting function which automatically stops the pumping operation of VODP pump circuit 150 with the potential of VODP that is not consumed. It is therefore obvious that "shutting down the step up circuit" referred to in some appended claims signifies "shutting down step down circuit 251".

The term "self refresh" refers to a function of the semiconductor device to refresh the information held by the memory cells autonomously at predetermined periods with an internal timer after clock enable signal CKE is inactivated. For example, the semiconductor device refreshes the information held by the memory cells once in every 7.8 µs, and the sense amplifiers operate for about 50 ns in each refreshing operation. The present invention is particularly advantageous in the self refresh mode.

Figure 5:
FIG. 5 is a waveform diagram showing voltage changes on bit line pairs BL, /BL in a refreshing mode.

FIG. 5 shows voltage changes on bit lines BL, /BL when the semiconductor device according to the present exemplary embodiment is in the refresh mode. When the semiconductor device is in the refresh mode, since array voltage VARY +1.05 V is applied from the initial stage of sensing operation without overdriving operation, the sensing time is longer than when the semiconductor device is in overdriving operation. It is thus preferable to increase a word line activating time represented by timing signal SAP1 until data are rewritten into the memory cells, i.e., until restoring operation is finished. The potential of line VOD is slightly lowered from the voltage of +1.05 V in the initial stage of sensing operation. Such a potential drop is caused by the response speed of step down circuit 253, and does not have an essential effect on the operation of the semiconductor device according to the present exemplary embodiment.

When the semiconductor device according to the present exemplary embodiment is in the refresh mode, the operation of the step up circuit is stopped, allowing the voltage of +1.05 V generated by the step down circuit to be applied to line CSP from the initial stage of sensing operation. The operational mode of the semiconductor device can be divided into certain examples depending on how transistors TR1, TR2 as CSP driver transistors are energized in the refresh mode, and also on which step down circuit applies the lowered voltage to line CSP in relation to transistors TR1, TR2. The examples of the operational mode of the semiconductor device will be described below based on the driving timings of transistors TR1, TR2 in the refresh mode. The timing of operation in the normal mode of the memory cells is shared by the examples, wherein the overdrive voltage which is higher than the external power supply voltage is generated according to a charging sharing scheme, and will be described below with respect to Example 1.

Example 1

According to Example 1, in the refresh mode, timing signal SAP1 is rendered inactive at all times, and the voltage of +1.05 V is applied from the line for array voltage VARY to line CSP by transistor TR2 using only timing signal SAP2. Since the voltage of +1.05 V applied to line CSP is supplied from the line for array voltage VARY, step down circuit 253 shown in FIG. 4 does not need to be included.

Figure 6:
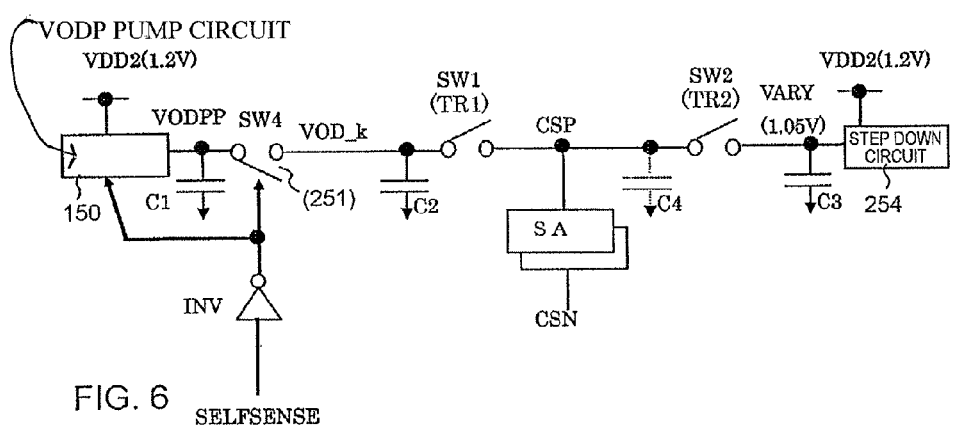
FIG. 6 is a diagram illustrative of operating principles.

FIG. 6 shows the operating principles of Example 1. In FIG. 6, for illustrative purposes, conduction states of transistors TR1, TR2 are represented respectively switches SW1, SW2, and the operation of step down circuit 251 generating the voltage of +1.4 V is represented by switch SW4. Inverter INV inverting signal SELFSENSE is added to illustrating the shutting down of VODP pump circuit 150 and step down circuit 251 when signal SELFSENSE is activated, so that the output signal of inverter INV controls operation of VODP pump circuit 150 and step down circuit 251.

When the semiconductor device is in the standby mode, VODP pump circuit 150 is activated and outputs voltage VODPP of +1.4 V to charge capacitor C1. After the initial state of operation of sense amplifier SA, the line for overdrive voltage VOD_k is set to +1.4 V by switch SW4, i.e., by making high activating signal VODN_VODP_k for step down circuit 251, thereby charging capacitor C2 to the voltage. When the operation of the sense amplifier SA is finished, equalizing circuit 162 set lines CSP, CSN to an equalizing potential of +0.525 V, which is one-half of array voltage VARY.

When the semiconductor device starts to operate in the normal mode to gain an external access, such as an access for outputting data read from memory cells to an external circuit, based on, for example, the activation of word lines with an active command, switch SW1 (i.e., transistor TR1) is initially rendered conductive to connect the CSP potential, which has been equalized to +0.525 V, to the VOD_k potential of +1.4 V. As a result, the final potential of line SCP reaches VARY voltage of +1.05 V due to a charge sharing process involving charge amount QCSP (=C4×0.525 V) of line CSP and charge amount QCVOD_k (=C2×1.4 V) of capacitor C2, where C4 represents a parasitic capacitance as described above. Thereafter, switch SW1 is rendered nonconductive and switch SW2 (i.e., transistor TR2) is rendered conductive, keeping the potential of line CSP at array voltage VARY. When switch SW1 is rendered nonconductive, the discharged line for voltage VOD_k is recharged from +1.05 V to +1.4 V through switch SW4. As the semiconductor device is in the charge sharing process, switch SW1 and switch SW4 are alternately switched in the normal mode.

In the refresh mode, the operation of VODP pump circuit 150 and step down circuit 251 is stopped depending on signal SELFSENSE, rendering switch SW4 nonconductive. Switch SW1 is controlled in the same manner as with the normal mode. As a result, from the initial stage of sensing operation, the voltage is supplied from the line for array voltage VARY to line CSP, causing the potential of line CSP to fluctuate between array voltage VARY of +1.05 V and the equalized voltage of +0.525 V.

Figure 7:
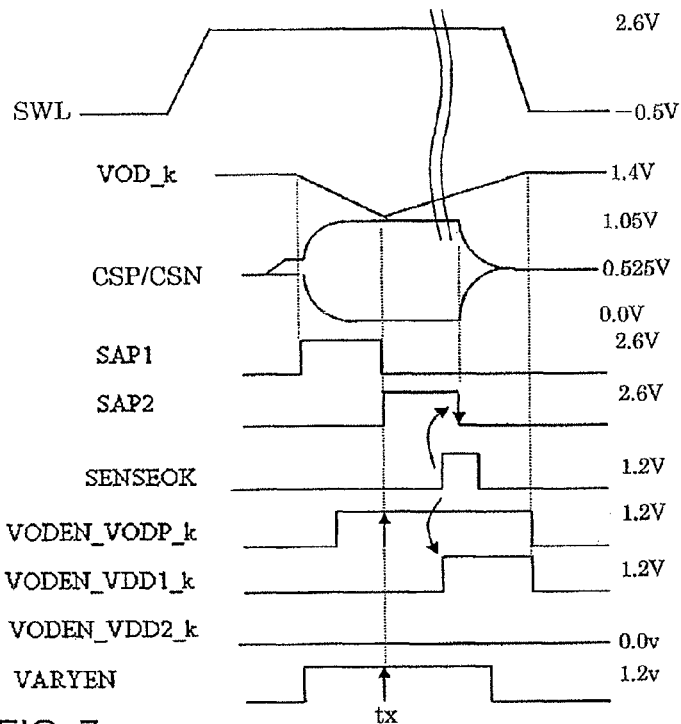
FIG. 7 is a waveform diagram showing operation timings when the semiconductor memory device is in a normal mode.

FIG. 7 is a waveform diagram showing operation timings when the semiconductor device according to Example 1 is in the normal mode. In the normal mode, as described above, power supply voltage VPP which has been increased from external power supply voltage VDD2 of +1.2 V by VODP pump circuit 150 is lowered into a voltage of +1.4 V by step down circuit 251, and an initial stage of sensing operation is carried out with the lowered voltage of +1.4 V. If the semiconductor device is a two-power-supply device using two external power supply voltages of +1.8 V and +1.2 V, then step down circuit 252 which uses other external power supply voltage VDD1 of +1.8 V as a main power supply is operated concurrently to reduce the current consumed under external power supply voltage VDD2 of +1.2 V. After the initial stage of sensing operation, timing signal SAP1 is set to a low level and timing signal SAP2 to a high level, supplying the potential from the line for array voltage VARY to line CSP. Timing signals SAP1, SAP2 are switched at timing tx in FIG. 7. Activating signal VODEN_VODP_k applied to step down circuit 251 and activating signal VARYEN applied to step down circuit 254 are activated earlier than timing tx in order to compensate for a delay in the response speed of step down circuits 251, 254. Activating signal VODEN_VDD2_k is kept at a low level, i.e., inactivated, at all times, so that step down circuit 253 does not operate.

Activating signal VODEN_VDD1_k is a signal applied to step down circuit 252 generating a voltage of +1.4 V from the external power supply voltage of +1.8 V. Since activating signal VODEN_VODP_k is activated, i.e., set to a high level, earlier than activating signal VODEN_VDD1_k, the overdrive voltage of +1.4 V to be applied to line VOD_k is generated mainly from VODP pump circuit 150 via step down circuit 251. If the semiconductor device is not a two-power-supply device, then step down circuit 252 is not provided, and hence activating signal VODEN_VDD1_k is not used.

In FIG. 7, signal SENSEOK represents a timing at which the sensing operation of the sense amplifier is essentially finished. When signal SENSEOK goes high, timing signal SAP2 goes low immediately thereafter, after which the potentials of lines CSP, CSN quickly converge to the equalized potential, and the potential of the line for voltage VOD_k changes to +1.4 V, shifting the semiconductor device from the sensing operation to the standby mode.

Example 2

Operation of Example 2 will be described below.

As described above, when the semiconductor device according to the present exemplary embodiment is in the normal mode, it performs the sensing operation at a high speed with overdrive voltage VOD_k of +1.4 V. Therefore, as shown in FIG. 3, transistors TR1 activated by timing signal SAP1 to drive line CSP to voltage VOD_k are associated with the respective sense amplifiers, and are embedded in the sense amplifier band. In other words, the drive transistors overdriving line CSP are distributed in position. After the initial stage of sensing operation with voltage VOD_k, line CSP is driven to array voltage VARY of +1.05 V, i.e., a bit line potential, by transistors TR2 activated by timing signal SAP2. As shown in FIG. 3, each transistor TR2 is disposed in association with a plurality of sense amplifiers in a crossing region where the sense amplifier band and the sub-word driver cross each other. In other words, the CSP drive transistors which drive line CSP to the bit line voltage are disposed in centralized locations. Since the sensing operation is performed at a high speed by overdrive voltage VOD_k of +1.4 V, transistors TR2 energized by timing signal SAP2 are smaller in size or has a smaller total current drive capability (i.e., total dimensions) than transistors TR1 energized by timing signal SAP1.

In the refresh mode, if array voltage VARY is to be applied to line CSP only by transistors TR2, as with Example 1, the sensing time in the refresh mode is likely to be greatly increased because the voltage is low and the current drive capability of transistors TR2 is small.

According to Example 2, line CSP is driven by many transistors TR1 disposed in the memory array even when the semiconductor device is in the refresh mode. Inasmuch as transistors TR1 are basically used to apply the overdrive voltage, Example 2 employs step down circuit 253 generating voltage VARYN equal to array voltage VARY of +1.05 V from external power supply voltage VDD2 of +1.2 V, and applies voltage VARYN of +1.05 V generated by step down circuit 253 as an overdrive voltage to the line for the overdrive voltage and also to line CSP via transistors TR1. In this manner, the problem of the insufficient current drive capability of the CSP drive transistors in the refresh mode is solved. The overdrive voltage of +1.05 V is generated from the external power supply voltage of +1.2 V, and is not generated through the step down circuit. Therefore, the semiconductor device is free of the problem of an increased power consumption caused by the operation of the step up circuit. According to Example 2, consequently, VODP pump circuit 250 and step down circuit 251 are operated and step down circuit 253 is shut down in the normal mode, and VODP pump circuit 250 and step down circuit 251 are shut down and step down circuit 253 is operated in the refresh mode.

Figure 8:
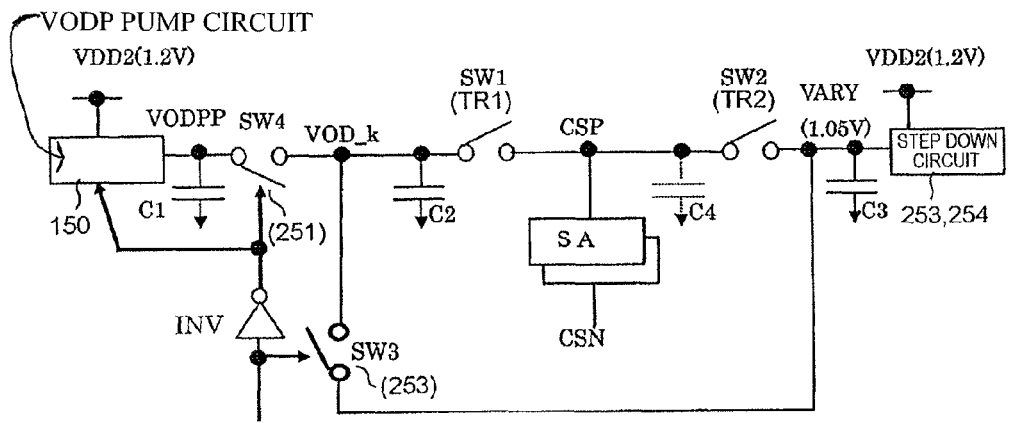
FIG. 8 is a diagram illustrative of operating principles of Examples 2, 3.

FIG. 8 shows the operating principles of Example 2. As shown in FIG. 8, Example 2 is similar to Example 1 shown in FIG. 6 except that switch SW3 whose conduction state is controlled by signal SELFSENSE is inserted between the line for overdrive voltage VOD_k and the line for array voltage VARY. Switch SW represents the operation state of step down circuit 253. In FIG. 8, the function of step down circuit 253 to generate the voltage of +1.05 V is included in the function of step down circuit 254 to generate the voltage of +1.05 V.

When the semiconductor device is in the standby mode, Example 2 operates in the same manner as with Example 1 shown in FIG. 6. When the semiconductor device is in the normal mode, since switch SW3 is nonconductive, Example 2 operates in the same manner as with Example 1 shown in FIG. 6. In the refresh mode, VODP pump circuit 150 and switch SW4 are shut down and rendered nonconductive, respectively, and switch SW3 is rendered conductive. Switch SW1 is rendered conductive at given timing. Switch SW2 (i.e., transistor TR2) may remain nonconductive because the current drive capability of transistors TR2 energized by timing signal SAP2 is smaller than the total current drive capability of transistors TR1 energized by timing signal SAP1 as described above. As a result, from the initial stage of sensing operation, the voltage is applied from the line for array voltage VARY to line CSP, causing the potential of line CSP to fluctuate between array voltage VARY of +1.05 V and the equalized voltage of +0.525 V.

Figure 9:
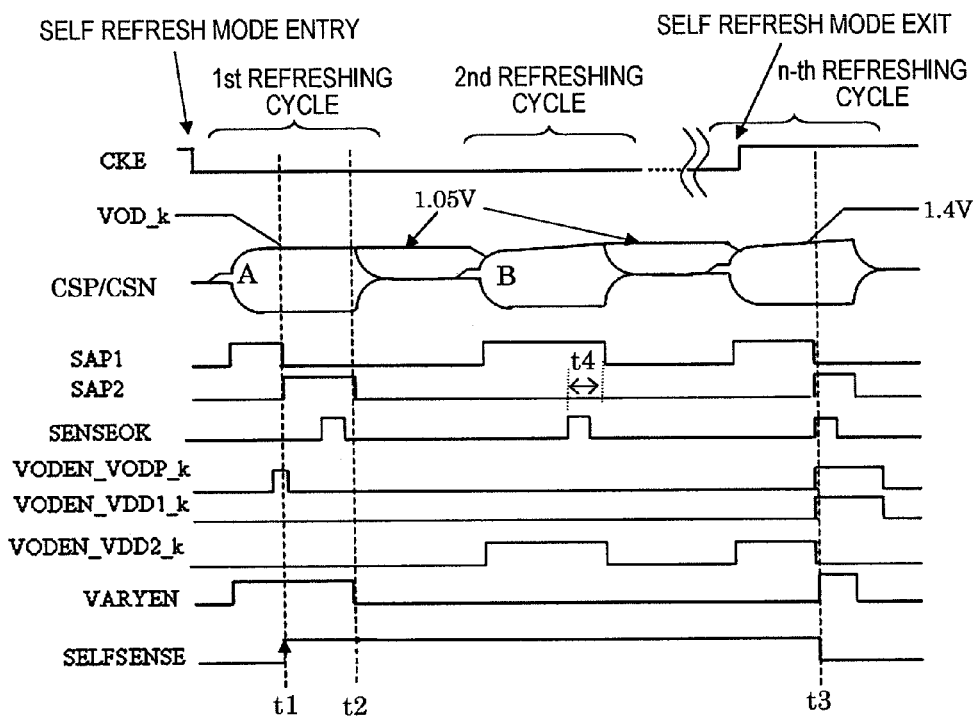
FIG. 9 is a waveform diagram showing operation timings when the semiconductor memory device is in a refreshing mode.

FIG. 9 is a waveform diagram showing operation timings when the semiconductor device according to Example 2 is in the refresh mode.

When clock enable signal CKE supplied from an external circuit to the semiconductor device goes low and is inactivated, the semiconductor device changes from the normal mode to the self refresh mode, i.e., self refresh mode entry occurs. At this time, since the potential of the line for overdrive voltage VOD_k is the same as the potential in the normal mode, the semiconductor device according to Example 2 operates in the same manner as when the semiconductor device according to Example 1 operates in the normal mode as shown in FIG. 7 after the self refresh mode entry until timing signal SAP2 goes high and the power supply voltage for driving line CSP changes to array voltage VARY of +1.05 V. Timing signal SAP2 goes high at time t1 when signal SELFSENSE also transits to high from low. After the power supply voltage for driving line CSP changes to array voltage VARY of +1.05 V, VODP pump circuit 150 and step down circuit 251 cause the potential of the line for overdrive voltage VOD_k to recover a voltage level of +1.4 V in the normal mode, but the potential of the line for overdrive voltage VOD_k remains at a voltage level of +1.05 V in the refresh mode, i.e., the voltage level at the time the initial stage of sensing operation is finished. After the semiconductor device changes to the self refresh mode, when it operates in a first refreshing cycle, line CSP is driven with the same voltage of +1.4 V as with a refreshing cycle in the normal mode, so that the voltage of line CSP goes high in a good waveform. However, as signal SELFSENSE has been activated, VODP pump circuit 150, step down circuit 251, and step down circuit 252 do not operate, and the potential of the line for overdrive voltage VOD_k does not return to +1.4 V. At time t2, timing signal SAP2 and activating signal VARYEN go low simultaneously. In the refreshing cycle in the normal mode, the sense amplifiers are operated by read access from an external circuit.

From a next refreshing cycle on, i.e., a second refreshing cycle on, only timing signal SAP1 and activating signal VODEN_VDD2_k for step down circuit 251 are activated, and other activating signals VODEN_VODP_k, VODEN_VDD1_k, and VARYEN are not activated in the period of sensing operation. The potential of the line for overdrive voltage VOD_k is kept at voltage VARYN of +1.05 V generated from external power supply voltage VDD2 of +1.2 V. From the initial stage of sensing operation, line CSP is driven to +1.05 V by many transistors TR1 disposed in the memory array with timing signal SAP1.

The operation of the semiconductor device in the self refresh mode is repeated from the second refreshing cycle to an (n−1)-th refreshing cycle. In an n-th refreshing cycle, clock enable signal CKE goes high, taking the semiconductor device out of the self refresh mode (i.e., self refresh mode exit). At this time, the potential of the line for overdrive voltage VOD_k is the same as array voltage VARY of +1.05 V, and the semiconductor device is not immediately able to perform overdriving operation in the normal mode. Consequently, even after the self refresh mode exit, the semiconductor device operates in the same manner as with the self refresh mode until signal SENSEOK indicative of the timing to essentially end the sensing operation goes high. When signal SENSEOK goes high at time t3, signal SELFSENSE goes low, i.e., is inactivated, and timing signal SAP1 goes low and timing signal SAP2 goes high, disconnecting line CSP from the line for overdrive voltage VOD_k and connecting line CSP to the line for array voltage VARY. In addition, at time t3, VODP pump circuit 150 resumes its operation, and activating signals VODEN_VODP_k, VODEN_VDD1_k go high, making step down circuits 251, 252 resume their operation. The potential of the line for overdrive voltage VOD_k then recovers +1.4 V, making the semiconductor device ready for sensing operation in the normal mode.

In FIG. 9, if the waveforms between time t1 and time t3 are removed and the waveform prior to time t1 and the waveform subsequent to time t3 are joined to each other, the resultant waveform represents sensing operation in the normal mode.

The waveform of the voltage of line CSP in each refreshing cycle will be discussed below. The voltage of line CSP in the first refreshing cycle which is driven by the voltage of +1.4 V goes high at point A in FIG. 9, and the voltage of line CSP in the second and subsequent refreshing cycles which is driven by the voltage of +1.05 V goes high at point B in FIG. 9. The voltage going high at point B is naturally later than the voltage going high at point A. In refreshing cycles which do not require external access, the voltage of line CSP which goes high slowly poses no problems unlike the normal mode which require quick external access.

As described above with respect to Example 1, if timing signal SAP1 is inactivated and line CSP is driven in the refresh mode only by timing signal SAP2 which is used to apply the voltage of +1.05 V to line CSP in a later stage of sensing operation in the normal mode, then the voltage of line CSP goes high longer than when it does at point B due to the drive capability of transistors TR2. According to Example 2, line CSP is driven by using timing signal SAP1. If transistors TR2 are energized concurrently by timing signal SAP2, then even though the current drive capability of transistors TR2 is smaller than the total current drive capability of transistors TR1, transistors TR2 perform an assistive function to enable the voltage of line CSP to go high more quickly.

In Example 2, since timing signal SAP2 does not go high but remains inactive in each of the second to (n−1)-th refreshing cycles, timing signal SAP1 remains high for a time longer than in the normal mode. Period t4 from the time when signal SENSOK goes high to the time when timing signal SAP1 goes low is longer than a period from the time when signal SENSOK goes high to the time when timing signal SAP2 goes low in the normal mode (see FIG. 7). Longer period t4 is introduced in order to deal with a delay of the period to restore the data into the memory cells due to the low voltage applied to line CSP. The period to restore the data refers to a period after the semiconductor device starts the sensing operation until the voltage of one of bit lines BL, /BL connected to the sense amplifiers reaches a voltage level which is 95% of array voltage VARY of +1.05 V.

Example 3

According to Example 2, in each of the second through (n−1)-th refreshing cycles after the semiconductor device changes to the self refresh mode, timing signal SAP2 remains low at all times and activating signal VARYEN applied to step down circuit 254 which outputs array voltage VARY remains low. For further shortening the period to restore the data in the refresh mode, array voltage VARY may be supplied from switch SW2 (i.e., transistors TR2) to line CSP, and timing signal SAP2 may be rendered high at the same timing as with timing signal SAP1. To render timing signal SAP2 high at the same timing as with timing signal SAP1, activating signal VARYEN is supplied to step down circuit 254 at the same timing in the normal mode as shown in FIG. 7 in order to enable step down circuit 254 to output array voltage VARY.

The exemplary embodiment and examples of the present invention have been described above. However, the fundamental technical concept of the present invention should not be interpreted as being applicable to only the illustrated exemplary embodiment and examples. In the above exemplary embodiment, the boosting process is stopped during the self refresh period of the semiconductor device. However, the fundamental technical concept of the present invention is also applicable to an automatic refresh mode which is controlled by each external command. Moreover, the disclosed semiconductor device comprises a semiconductor memory device with dynamic memory cells incorporating an overdriving function and a self refreshing function. The fundamental technical concept of the present invention is also applicable to other semiconductor devices, e.g., a full range of semiconductor devices including CPUs (Central Processing Units), MCUs (Micro Control Units), DSPs (Digital Signal Processors), ASICs (Application Specific Integrated Circuits), ASSPs (Application Specific Standard Products), etc. each incorporating a memory function. The semiconductor device according to the present invention may be available as products including SOCs (System On Chips), MCPs (Multi Chip Packages), POPs (Package On Packages), etc. The principles of the present invention are applicable to semiconductor devices in the form of the above products and packages. The fundamental technical concept of the present invention is not limited to sense amplifiers which amplifies information stored in memory cells, but may be applied to sense amplifiers which processes logic signals of ASICs and sense amplifiers which processes data signals of DSPs, etc. Specifically, for example, sense amplifiers to which the present invention is applicable may have a first mode in which they operate at a high speed with a first voltage and a second mode in which they operate for low power consumption with a second voltage lower than the first voltage. In other words, the scope of appended claims of the present invention is not limited to semiconductor memory devices.

The transistors of the semiconductor devices to which the present invention is applicable may be FETs (Field Effect Transistors), bipolar transistors, or other transistors. The FETs may be various types of FETs, including MOS (Metal Oxide Semiconductor) FETs, MIS (Metal Insulator Semiconductors) FETs, TFTs (Thin Film Transistors), etc. In addition, the principles of the present invention are also applicable to semiconductor devices including bipolar transistors and FETs.

P-channel transistors or PMOS (P-channel MOS) transistors are examples of first-conductivity-type transistors, and N-channel transistors or NMOS (N-channel MOS) transistors are examples of second-conductivity-type transistors. Semiconductor substrates used in semiconductor devices may be P-type semiconductor substrates, N-type semiconductor substrates, SOI (Silicon On Insulator) semiconductor substrates, or other semiconductor substrates.

In the exemplary embodiment and examples of the present invention, a pump circuit is used as a step up circuit. However, other step up circuits such as a DC-to-DC converter or the like may be used instead of the pump circuit. The pump circuits, the step down circuits, the sense amplifiers, the amplifiers, and the equalizing circuits are not limited to the circuit configurations disclosed in the exemplary embodiment and examples.

The various elements disclosed herein may be combined or selected in various ways within the scope of the appended claims of the present invention. It is apparent that the present invention covers various changes and modifications which those skilled in the art could conceive based on the entire disclosure and technical concept of the present invention including the scope of the appended claims.

What is claimed is:

1. A semiconductor device comprising:
   a sense amplifier;
   a step up circuit supplied with an external power supply voltage and outputting a voltage higher than said external power supply voltage;
   a first step down circuit supplied with said external power supply voltage and outputting a voltage lower than said external power supply voltage;
   a drive signal line connected to said sense amplifier, the drive signal line supplying electric power required to operate said sense amplifier;
   a first line connected to an output terminal of said step up circuit;
   a second line connected to an output terminal of said first step down circuit;
   a first switch connected between said first line and said drive signal line;
   a second switch connected between said second line and said drive signal line; and
   a control circuit;
   wherein in a normal mode, said control circuit renders said first switch conductive for a first period in an initial stage of operation of said sense amplifier, and, after said first period, said control circuit renders said first switch nonconductive and renders said second switch conductive for a second period, operating said sense amplifier at both the voltage higher than said external power supply voltage and the voltage lower than said external power supply voltage; and
   in a refresh mode in at least one refreshing cycle, while said step up circuit is being shut down, said control circuit renders either one or both of said first switch and said second switch conductive for a third period longer than the sum of said first period and said second period, operating said sense amplifier at the voltage lower than said external power supply voltage.

2. The semiconductor device according to claim 1, further comprising:
   an auxiliary step down circuit supplied with said external power supply voltage and outputting a voltage lower than said external power supply voltage, said auxiliary step down circuit having an output terminal connected to said first line.

3. The semiconductor device according to claim 2, wherein the voltage output from said first step down circuit is equal to the voltage output from said auxiliary step down circuit.

4. The semiconductor device according to claim 2, wherein said control circuit renders at least said first switch conductive to operate said sense amplifier in said refresh mode.

5. The semiconductor device according to claim 2, wherein in a first refreshing cycle after entering a self refresh mode, said control circuit renders said first switch to output the voltage of said first line which is higher than said external power supply voltage to said drive signal line, and in a second refreshing cycle which is a refreshing cycle after said first refreshing cycle, said control circuit renders said first switch to output the voltage of said first line which is lower than said external power supply voltage to said drive signal line.

6. The semiconductor device according to claim 5, wherein in a refreshing cycle including a time point of exit of said self refresh mode, said control circuit renders said first switch nonconductive and thereafter resumes operation of said step up circuit, applying the voltage output from said step up circuit to said first line.

7. The semiconductor device according to claim 1, comprising:
   a plurality of said sense amplifiers; and
   a plurality of said first switches associated respectively with said sense amplifiers;
   wherein the number of said first switches is greater than the number of said second switch.

8. The semiconductor device according to claim 1, wherein said step up circuit includes a pump circuit supplied with said external power supply voltage and a second step down circuit connected to an output terminal of said pump circuit, and
   said second step down circuit outputs a voltage higher than said external power supply voltage.

9. The semiconductor device according to claim 1, further comprising:
   a first capacitor connected to said first line; and
   a second capacitor representing a parasitic capacitance accompanying said drive signal line;
   wherein when said first switch is rendered conductive in the normal mode, a potential of said drive signal line is brought into conformity with the voltage output from said first step down circuit based on a charge amount of said first capacitor and a charge amount of said second capacitor.

10. A semiconductor device comprising:
    a sense amplifier;
    a step up circuit supplied with an external power supply voltage and outputting a first voltage higher than said external power supply voltage;
    a step down circuit supplied with said external power supply voltage and outputting a second voltage lower than said external power supply voltage;
    a drive signal line connected to said sense amplifier, for supplying electric power required to operate said sense amplifier, wherein said first voltage output from said step up circuit is applied to said drive signal line for operating said sense amplifier in a normal mode, and thereafter said second voltage output from said step down circuit is applied to said drive signal line; and a control circuit, in a refresh mode in at least one refreshing cycle, shutting down said step up circuit and applying only said second voltage from said step down circuit to said drive signal line for operating said sense amplifier.

11. The semiconductor device according to claim 10, wherein said control circuit applies said first voltage to said drive signal line in a first refreshing cycle after entering a self refresh mode, and applies only said second voltage to said drive signal line in a second refreshing cycle on.

12. A method of controlling a semiconductor device supplied with an external power supply voltage, said semiconductor device including a sense amplifier and a drive signal line connected to said sense amplifier, said drive signal line supplying electric power required to operate said sense amplifier, the method comprising:

operating a step up circuit in a normal mode;

applying a first voltage, generated by said step up circuit, higher than said external power supply voltage to said drive signal line for operating said sense amplifier in said normal mode;

after applying said first voltage, applying a second voltage, generated from said external power supply voltage by a first step down circuit, lower than said external power supply voltage to said drive signal line in said normal mode; and applying only said second voltage to said drive signal line without operating said step up circuit in a refresh mode in at least one refreshing cycle.

13. The method according to claim 12, further comprising:
charging a first capacitor with said step up circuit in said normal mode; and
sharing a charge amount of said first capacitor and a charge amount of a second capacitor accompanying said drive signal line in said normal mode, thereby making a potential of said drive signal line higher than said external power supply voltage, and thereafter applying said second voltage.

14. The method according to claim 12, further comprising:
in said refresh mode, applying another second voltage generated by a second step down circuit having a current drive capability greater than said first step down circuit, instead of the second voltage generated by said first step down circuit, to said drive signal line.

15. The method according to claim 14, further comprising:
in said refresh mode, applying the second voltages generated respectively by said first step down circuit and said second step down circuit to said drive signal line.

16. The method according to claim 12, further comprising:
after entering a self refresh mode, applying said first voltage to said drive signal line in a first refreshing cycle, and applying said second voltage to said drive signal line in a second refreshing cycle which is a refreshing cycle after said first refreshing cycle.

17. The method according to claim 16, wherein said step up circuit has an output terminal connected through a first switch to said drive signal line, further comprising:
after exit of said self refresh mode, rendering said first switch nonconductive and thereafter resuming operation of said step up circuit.

\* \* \* \* \*